US012716130B2

(12) United States Patent
Aminoff et al.

(10) Patent No.: US 12,716,130 B2
(45) Date of Patent: Aug. 25, 2026

(54) PRECURSOR SOURCE ARRANGEMENT AND ATOMIC LAYER DEPOSITION APPARATUS

(71) Applicant: BENEQ OY, Espoo (FI)

(72) Inventors: Hulda Aminoff, Espoo (FI); Pekka Soininen, Espoo (FI); Pekka J. Soininen, Espoo (FI); Ville Miikkulainen, Espoo (FI)

(73) Assignee: BENEQ OY, Espoo (FI)

(*) Notice: Subject to any disclaimer, the term of this patent is extended or adjusted under 35 U.S.C. 154(b) by 358 days.

(21) Appl. No.: 17/622,357

(22) PCT Filed: Jun. 26, 2020

(86) PCT No.: PCT/FI2020/050467
§ 371 (c)(1),
(2) Date: Dec. 23, 2021

(87) PCT Pub. No.: WO2020/260771
PCT Pub. Date: Dec. 30, 2020

(65) Prior Publication Data
US 2022/0243320 A1 Aug. 4, 2022

(30) Foreign Application Priority Data
Jun. 28, 2019 (FI) .................................... 20195592

(51) Int. Cl.
*C23C 16/448* (2006.01)
*C23C 16/455* (2006.01)

(52) U.S. Cl.
CPC .......... *C23C 16/448* (2013.01); *C23C 16/455* (2013.01); *C23C 16/45544* (2013.01); *C23C 16/45561* (2013.01)

(58) Field of Classification Search
CPC .............. C23C 16/448; C23C 16/4481; C23C 16/4482; C23C 16/4483; C23C 16/4485;
(Continued)

(56) References Cited

U.S. PATENT DOCUMENTS 4,027,727 A * 6/1977 Pullens ................ A47J 39/006 62/236
4,487,619 A * 12/1984 Jones ..................... F25B 21/04 62/177
(Continued)

FOREIGN PATENT DOCUMENTS

WO 2013064737 A2 5/2013

OTHER PUBLICATIONS

International Search Report issued by the Finnish Patent and Registration Office acting as the International Searching Authority in relation to International Application No. PCT/FI2020/050467 dated Sep. 29, 2020 (6 pages).
(Continued)

*Primary Examiner* — Kurt Sweely
(74) *Attorney, Agent, or Firm* — Carter, DeLuca & Farrell, LLP

(57) ABSTRACT

A precursor source arrangement for an atomic layer deposition apparatus for receiving a liquid precursor container for liquid precursor. The precursor source arrangement includes a precursor container support arrangement arranged to hold the liquid precursor container in inclined position relative to vertical direction.

15 Claims, 12 Drawing Sheets

(58) Field of Classification Search
CPC ........ C23C 16/45525; C23C 16/45544; C23C 16/45548; C23C 16/45553; C23C 16/45561; C23C 14/243; C23C 14/26; C23C 16/455
See application file for complete search history.

(56) References Cited

U.S. PATENT DOCUMENTS 4,612,772 A * 9/1986 Jones .................. C23C 16/4482 62/3.6
5,279,338 A * 1/1994 Goossens ............. B67D 7/0272 700/271
5,393,347 A * 2/1995 Miranda ........... H01L 21/67057 118/500
6,773,749 B1 * 8/2004 Moore ................ C23C 16/4412 427/248.1
7,118,783 B2 * 10/2006 Carpenter ........... C23C 16/4481 118/727
8,118,939 B2 * 2/2012 Atlas ................... C23C 16/4482 261/DIG. 65
8,235,364 B2 * 8/2012 Sarigiannis ......... C23C 16/4482 141/63
2001/0042523 A1 * 11/2001 Kesala ................ C23C 16/4481 122/6.6
2001/0045187 A1 11/2001 Uhlenbrock
2004/0000270 A1 1/2004 Carpenter et al.
2005/0008799 A1 * 1/2005 Tomiyasu ........... C23C 16/4481 428/34.1
2006/0112883 A1 6/2006 Suzuki et al.
2009/0263578 A1 * 10/2009 Lindfors ............. C23C 16/4485 427/248.1
2013/0104992 A1 * 5/2013 Yednak, III ........... F16K 27/003 137/334
2013/0216708 A1 8/2013 Yun
2013/0269608 A1 * 10/2013 Soderlund ......... C23C 16/45544 118/715
2013/0333768 A1 12/2013 Chandrasekharan et al.
2015/0145154 A1 5/2015 Chandrasekharan et al.
2015/0176153 A1 * 6/2015 Chang ................... C23C 16/448 137/487
2017/0191158 A1 7/2017 Poodt et al.
2018/0094351 A1 * 4/2018 Verghese ............ C23C 16/4481

OTHER PUBLICATIONS

Written Opinion of the International Searching Authority issued by the Finnish Patent and Registration Office acting as the International Searching Authority in relation to International Application No. PCT/FI2020/050467 dated Sep. 29, 2020 (7 pages).
Finnish Search Report issued by the Finnish Patent and Registration Office in relation to Finnish Application No. 20195592 dated Jan. 28, 2020 (2 pages).

* cited by examiner

PRECURSOR SOURCE ARRANGEMENT AND ATOMIC LAYER DEPOSITION APPARATUS

CROSS-REFERENCE TO RELATED APPLICATIONS

This application is a national phase entry under 35 U.S.C. 371 of PCT International Application No. PCT/FI2020/050467 filed Jun. 26, 2020, which claims priority to Finnish Patent Application No. 20195592, filed Jun. 28, 2019, the disclosure of each of these applications is expressly incorporated herein by reference in their entirety.

FIELD OF THE INVENTION

The present invention relates to a precursor source arrangement. The present invention further relates to an atomic layer deposition apparatus.

BACKGROUND OF THE INVENTION

In atomic layer deposition liquid materials are commonly used as precursors. The liquid materials supplied in gas phase to a reaction chamber. The liquid precursor is stored in a liquid precursor container and connected to the reaction chamber with a precursor supply channel. The precursor supply channel is provided with a precursor supply valve. The precursor is supplied to the reaction chamber by opening the supply valve for predetermined time such that a predetermined dose of gaseous precursor is supplied from the liquid precursor container to the reaction chamber. The size of the dose is dependent on vapour pressure of the liquid precursor in the liquid precursor container. The vapour pressure further is dependent on temperature of the precursor.

The atomic layer deposition apparatus and the reaction chamber thereof is usually operated in elevated temperatures. The elevated temperature of the reaction chamber or other surrounding heat sources may have an effect on temperature of the liquid precursor containers. Therefore, the liquid precursor containers are conventionally cooled in order to adjust and keep the temperature of the precursor in desired value. The temperature of the liquid precursor container is kept desired by the cooling the liquid precursor and the liquid precursor container below the surrounding temperatures such that the surrounding temperatures do not affect the temperature of the precursor and further the size of the dose.

One of the disadvantages of the prior art is that the size of the dose is difficult to control due to the considerably higher temperatures surrounding the liquid precursor container. Further, dosing or supplying the dose to the reaction chamber is slow due to substantially low vapour pressure of the precursor. The dosing or supplying becomes increasingly slow and difficult to control with small liquid precursor containers.

BRIEF DESCRIPTION OF THE INVENTION

An object of the present invention is to provide a precursor source arrangement and an atomic layer deposition apparatus so as to solve or at least alleviate the prior art disadvantages.

The objects of the invention are achieved with a precursor source. The objects of the invention are also achieved with an atomic layer deposition apparatus.

The preferred embodiments of the invention are disclosed in the dependent claims.

The invention is based on the idea of providing a precursor source arrangement for an atomic layer deposition apparatus for receiving a liquid precursor container for liquid precursor. The precursor source arrangement comprises a precursor container support arrangement arranged to hold the liquid precursor container in fixed inclined position relative to vertical direction.

The inclined position relative to vertical position means a position between vertical direction and horizontal direction. The liquid precursor container comprises an outlet opening and a bottom or bottom wall opposite outlet opening. The liquid precursor container further comprises a container axis extending between the outlet opening and the bottom. Thus, the liquid precursor container is in fixed inclined position relative to vertical direction when the container axis extends in the inclined position when the liquid precursor container is installed to the precursor source arrangement and supported to the precursor container support arrangement.

Vaporization of liquid precursor is dependent on the surface area of the liquid material and the temperature of the liquid material. Arranging the liquid precursor container to the inclined position enables increasing the surface area of the liquid inside the liquid precursor container. Therefore, more liquid precursor may vaporize and be supplied in a time unit during dosing or supplying precursor to the reaction chamber by opening the supply valve.

In one embodiment, the precursor container support arrangement comprises a container support member defining an inclined support plane inclined relative to vertical direction for supporting the liquid precursor container in the inclined position.

In this embodiment, the liquid precursor container is supported on the inclined support plate such that the liquid precursor container may be against the inclined support plane. The inclined support plane provides good support for the liquid precursor container.

In one embodiment, the container support member comprises a support surface against which the liquid precursor container is arranged to be supported, the support surface forming the support element of the precursor container support arrangement and providing the inclined support plane inclined relative to vertical direction for supporting the liquid precursor container.

The support surface enables increased contact area between the support plane and liquid precursor container. The support surface may also provide good support along the liquid precursor container.

In another embodiment, the container support member comprises two or more separate support elements having separate support surfaces, respectively, the separate support surfaces of the two or more separate support elements defining together the inclined support plane inclined relative to vertical direction for supporting the liquid precursor container.

The two or more separate support elements may provide light structure for the precursor container support arrangement. Further, the two or more separate support elements may provide precursor container support arrangement suitable for liquid precursor containers with different dimensions.

In one embodiment, the container support member is a support plate having the support surface arranged to receive and support the liquid precursor container. The support plate may be planar plate providing support suitable for different liquid precursor containers with contact area along the liquid precursor container.

In another embodiment, the container support member is a support plate having a longitudinal recess extending along the support surface arranged to receive and support the liquid precursor container. In this embodiment, the longitudinal recess or any other kind of recess arranged to receive the liquid precursor container. The recess defines or forms the support surface or the inner surface of the recess defines or forms the support surface. Accordingly, the recess may form a concave support surface. Thus, the recess or the support surface surrounds or encloses the liquid precursor container at least partly inside the recess or hole. Therefore, the recess provides increased contact area between the liquid precursor container and the support surface.

In a further embodiment, the container support member is provided as a sleeve comprising the support surface and a longitudinal recess extending along the support surface arranged to receive and support the liquid precursor container. In this embodiment, the support surface is formed by the inner surface of the sleeve. The sleeve is a tubular member having a tubular hole arranged to receive the liquid precursor container. In this embodiment, the contact area between the liquid precursor container and the support surface is further increased such that the support surface surrounds the liquid precursor container.

In one embodiment, the inclined support plane or the support surface is inclined relative to vertical direction an inclination angle, the inclination angle being between 5 to 75 degrees, preferably, and between 10 to 60 degrees, and more preferably between 20 to 50 degrees.

Increasing the inclination angle of the liquid precursor container also increases the surface of the liquid inside the liquid precursor container. However similarly, increasing the inclination angle of the liquid precursor container also increases the footprint of the liquid precursor container and/or the container support member. Therefore, inclination angle between 20 to 50 degrees relative to the vertical direction is desirable.

In the context of this application, the precursor container support arrangement is arranged to support the precursor container in fixed inclined position relative to the vertical direction. The fixed inclined position means that the precursor container is supported in fixed manner such that precursor container is place in immobile manner. Accordingly, the precursor container support arrangement is arranged to support the precursor container and hold the precursor container still. Thus, liquid precursor material inside the precursor container remains still keeping the liquid surface of the liquid precursor also still. Thus, the vaporization of the liquid precursor may be well controlled.

In one embodiment, the precursor container support arrangement comprises a container heating element for heating the liquid precursor container. The container heating element is arranged to heat the precursor material for increasing the vapour pressure of the precursor and thus the size of the dose or speed of the supply together with the increased surface area of the liquid precursor.

In another embodiment, the precursor container support arrangement comprises a container heating element provided in heat transfer connection with the container support member for heating the liquid precursor.

Therefore, the container heating element is arranged to heat the container support member such that the container support member further transfers the heat or thermal energy to the liquid precursor container and further to the liquid precursor. The container support member thus provides a heat transfer element.

In one embodiment, the container heating element is connected to the container support member and arranged to heat the container support member for heating the liquid precursor container.

Thus, the container heating element is arranged to transfer heat or thermal energy to the container support member by conduction.

In an further embodiment, the container heating element is provided to the container support member and arranged to heat the container support member for heating the liquid precursor container.

In one embodiment, the container support member is made of aluminium or other good heat transfer material enabling efficient heat transfer to the liquid precursor container.

In another embodiment, the container heating element is connected to the container support member such that the container support member extends upwards from the container heating element. The container heating element is arranged to heat the container support member for heating the liquid precursor container.

When the container support member extends upwards from the container heating element the outlet opening of the liquid precursor container may be placed to the upper end of the liquid precursor container from where the precursor is supplied from the liquid precursor container. Thus, the precursor leaves the liquid precursor container in direction of increasing thermal gradient due to natural convection.

In one embodiment, the precursor source arrangement comprises two adjacently or successively arranged container support members arranged to hold the liquid precursor containers in different inclined positions relative to vertical direction.

This configuration enables arranging the container support member and further the liquid precursor containers in compact manner to the precursor source arrangement. Further, it should be noted that the inclined position of the liquid precursor containers makes installing and uninstalling and replacing the liquid precursor containers easier as necessary tools used manually may also be used in inclined position for the installing and uninstalling. Further, different inclination angles may be chosen for different liquid precursor materials.

In another embodiment, the precursor source arrangement comprises two adjacently or successively arranged container support members comprising container support members defining inclined support planes inclined at different angles relative to vertical direction for supporting the liquid precursor container in the inclined position.

Accordingly, the container support member s may comprise support planes or container support surfaces which have different inclination angles for arranging the liquid precursor containers to different inclination angles relative to the vertical direction.

In one embodiment, the precursor source arrangement comprises a base plate, and a first and a second container support members connected on the base plate and arranged adjacently or successively to each other and to extend from the base plate in the inclined positions relative to the vertical direction. The second container support member being connected on the base plate under the first container support member.

Thus, the first and second container support members are arranged in compact manner to the precursor source arrangement by utilizing the inclined position. The footprint of the container support members is decreased.

In another embodiment, the precursor source arrangement comprises the heating element, and a first and a second container support members connected on the heating element and arranged adjacently or successively to each other and to extend from the heating element in the inclined positions relative to the vertical direction. The second container support member being connected on the heating element under the first container support member.

This provides a compact structure in which the first and second container support member are heated with the same heating element.

In one embodiment, two or more the container support members are connected to the same container heating element.

Accordingly, one heating element is arranged to heat two or more container support members and the container support members are provided as heat transfer elements for heating the liquid precursor container.

In another embodiment, the precursor container support arrangement comprises two or more container heating elements, and one or more container support members are connected to each of the container heating element.

Accordingly, different temperatures may be utilized for different liquid precursors.

In one embodiment, the precursor source arrangement comprises a valve support member, one or more precursor supply valves being supported to the valve support member.

The outlet opening of the liquid precursor container is connected to the supply valve with a container outlet channel. Thus, the valve support member is provided separately from the container support member.

In another embodiment, the precursor source arrangement comprises two or more valve support members, and one or more precursor supply valves is supported to each of the valve support members.

Accordingly, the one or more supply valves may be supported separately from each other.

In one embodiment, the valve support member comprises a valve heating element provided to the valve support member for heating the one or more precursor supply valves.

Thus, the temperature of the supply valves may be controlled separately from the container support member and thus an increasing temperature gradient may be achieved.

In another embodiment, the precursor source arrangement comprises a valve heating element connected to the valve support member for heating the one or more precursor supply valves.

In still another embodiment, the precursor source arrangement comprises a valve heating element provided in heat transfer connection with to the valve support member for heating the one or more precursor supply valves.

Accordingly, the valve support member may comprise the heating element or the heating element may be arranged in heat transfer connection with the valve support member.

In one embodiment, the valve support member is arranged in vertical direction above the precursor container support arrangement.

In another embodiment, the valve support member is arranged in vertical direction above the container support member.

This enables utilizing increasing temperature gradient caused by natural convection in the precursor source arrangement.

In one embodiment, the precursor source arrangement comprises a precursor source compartment having a compartment space. The precursor compartment comprises a partitioning wall arranged to divide the compartment space to an upper compartment space and a lower compartment space provided below the upper compartment space. In one embodiment, the precursor container support arrangement is provided to the lower compartment space and the valve support member is provided to the upper compartment space.

In another embodiment, the container support member is provided to the lower compartment space and the valve support member is provided to the upper compartment space.

The partitioning wall decreases heat transfer between the upper and lower part of the compartment. The upper and lower compartment space may be kept in different temperatures and an increasing temperature gradient may be achieved from the lower compartment space to the upper compartment space along the supply path of the precursor.

The present invention further relates to an atomic layer deposition apparatus for processing a substrate according to principles of atomic layer deposition method. The apparatus comprises a vacuum chamber, a reaction chamber inside the vacuum chamber, and a process heater arranged inside the vacuum chamber for heating the reaction chamber inside the vacuum chamber. The apparatus further comprises a precursor source arrangement for one or more liquid precursor containers, a lead-through connection provided to and extending from the vacuum chamber between the vacuum chamber and the precursor source arrangement, and one or more precursor supply channels extending from the precursor source arrangement inside the vacuum chamber via the lead-through connection. The one or more precursor supply channels are provided with one or more precursor supply valves for supplying precursors.

According to the present invention, the precursor source arrangement comprises a container support member defining an inclined support plane inclined relative to vertical direction for supporting the liquid precursor container in fixed inclined position relative to vertical direction, and a valve support member, the one or more precursor supply valves being arranged to the valve support member. The valve support member is connected to the lead-through connection for providing heat transfer from the vacuum chamber to the valve support member.

Accordingly, the inclined support plane enables increasing the surface area of the liquid precursor inside the liquid precursor container for more speed to the dosing or supplying the precursor and further the heat transfer from the vacuum chamber enables increasing temperature gradient towards the reaction chamber.

In one embodiment, the precursor source arrangement comprises a precursor source compartment having a compartment space, the precursor compartment comprises a partitioning wall arranged to divide the compartment space to upper compartment space and lower compartment space provided below the upper compartment space. The container support member is provided to the lower compartment space and lead-through connection and the valve support member are provided to the upper compartment space.

The partitioning wall decreases heat transfer between the upper and lower part of the compartment. The upper and lower compartment space may be kept in different temperatures and an increasing temperature gradient may be achieved from the lower compartment space to the upper compartment space along the supply path of the precursor and further towards the vacuum chamber and reaction chamber.

The precursor source arrangement may be any of the precursor source arrangements described above.

The above disclosed embodiments of the invention may be combined in any manner.

Vaporization of liquid precursor is dependent on the surface area of the liquid material and the temperature of the liquid material. Arranging the liquid precursor container to the inclined position enables increasing the surface area of the liquid inside the liquid precursor container. Therefore, more liquid precursor may vaporize and be supplied in a time unit during dosing or supplying precursor to the reaction chamber by opening the supply valve. The inclined position of the container support members and the liquid precursor containers enables compact arrangement and easy installation or uninstallation of liquid precursor containers in the compact arrangement. Further, the present invention enables providing increasing temperature gradient towards the vacuum chamber and reaction chamber such that condensation of precursor may be avoided.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
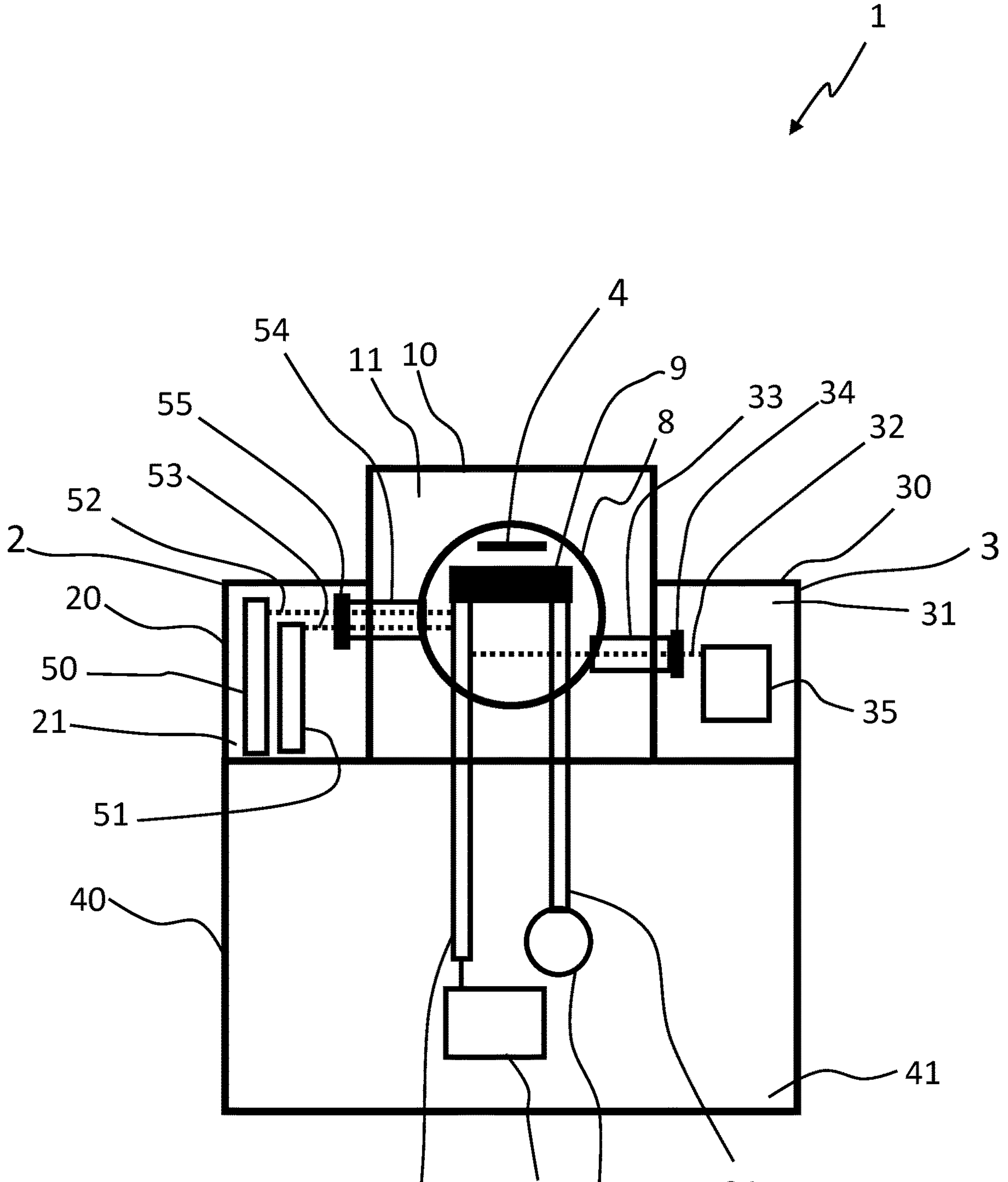
FIG. 1 shows a schematic view of one embodiment of an atomic layer deposition apparatus.

FIG. 1 shows a schematic view of an atomic layer deposition apparatus 1 for processing a substrate according to principles of atomic layer deposition method. The apparatus 1 comprises a vacuum chamber 8 and a reaction chamber 9 inside the vacuum chamber 8. Substrates are processed inside the reaction chamber. In some embodiment, the vacuum chamber 8 and the reaction chamber 9 may form one single chamber.

The vacuum chamber 8 and the reaction chamber 9 are arranged inside a reactor compartment space 11 of a reactor compartment or reactor casing 10 surrounding the vacuum chamber 8.

The apparatus further comprises a process heater 4 arranged inside the vacuum chamber 8 for heating the reaction chamber 9 inside the vacuum chamber 8. The process heater 4 is provided outside of the reaction chamber 9 for radiation heating the reaction chamber 9 and the substrate during processing. The process heater 4 heats the reaction chamber 9 to the process temperature which may be for example 150 to 400° C.

The apparatus comprises an inlet channel 92 extending from outside the vacuum chamber 8 into the vacuum chamber 8 and to the reaction chamber 9 for supplying precursors into the reaction chamber 9. The inlet channel 92 is connected to a supply unit 95 comprising process valves and gas connections for carrier gas, purge gas or other gaseous materials supplied to the reaction chamber 9. The apparatus further comprises an outlet channel 94 extending from the reaction chamber 9 inside the vacuum chamber 8 to outside of the vacuum chamber 8 for discharging precursors and other gases from the reaction chamber 9. A filter unit 96 is provided to the outlet channel 94 for filtering the gases discharged from the reaction chamber 9.

The inlet channel 92 and the outlet channel 94 extend to the vacuum chamber 8 and the reaction chamber 9 in vertical direction and from below the vacuum chamber 8 and the reaction chamber 9.

The supply unit 95 and the filter unit 96 are arranged to an instrumentation compartment 40 and inside an instrumentation space 41 of the instrumentation compartment 40. The instrumentation compartment 40 is provided in vertical direction below the reactor compartment 10. The inlet channel 92 and the outlet channel 94 extend from the instrumentation compartment 40 to the reactor compartment 10.

The apparatus also comprises a precursor source arrangement 2 for receiving one or more precursor containers and for supplying precursor materials to the reaction chamber 9.

The apparatus comprises a first lead-through connection 54 provided to and extending from the vacuum chamber 8 between the vacuum chamber 8 and the precursor source arrangement 2. Thus, the lead-through connection 54 extends between the vacuum chamber 8 and the precursor source arrangement 2. One or more precursor supply conduits 52, 53 are arranged to extend from the precursor source arrangement 2 inside the vacuum chamber 8 via the lead-through connection 54, as shown in FIG. 1.

The lead-through connection 54 is provided with a first precursor supply connection 55 in the precursor source arrangement 2. The precursor supply conduits 52, 53 are connected to the first precursor supply connection 55 in the precursor source arrangement 2. The precursor supply connection 55 may be flange or a plate or the like to which the precursor supply conduits 52, 53 may be connected or attached.

The precursor supply conduits 52, 53 are further connected to the inlet channel 92 inside the vacuum chamber 8 for supplying precursor material into the reaction chamber 9.

The precursor source arrangement 2 comprises one or more precursor container support members 50, 51 for receiving and supporting precursor containers for receiving and holding precursor containers in the precursor source arrangement 2. The precursor supply conduits 52, 53 extend between the precursor containers and to the inlet channel 92 inside the vacuum chamber 8. Thus, the precursor supply conduits 52, 53 extend from the precursor source arrangement 2 and from the precursor containers via the first lead-through connection 54 and the first precursor supply connection 55 to the inlet channel 92 inside the vacuum chamber 8. The precursors are supplied to the reaction chamber 9 along the precursor supply conduits 52, 53.

The precursor source arrangement 2 further comprises precursor supply valves arranged to control the supply of precursors from the precursor containers to the inlet channel 92 and further to the reaction chamber 9. The precursor supply valves are provided to the precursor supply conduits 52, 53. Thus, each of the precursor supply conduits 52, 53 comprises at least one precursor supply valve. Dosing or supplying of the precursors to the reaction chamber 9 is carried out by opening and closing the precursor supply valves.

The precursor source arrangement 2 further comprises a precursor source casing 20 or compartment surrounding one or more precursor container support members 50, 51 and further the precursor supply valves. The precursor container support members 50, 51 and the precursor supply valves are arranged inside the precursor source casing 20 in a precursor source casing space 21.

The precursor source arrangement 2 is provided for liquid precursors and liquid precursor containers.

The apparatus 1 may also comprise a second precursor source arrangement 3 for receiving one or more second precursor containers and for supplying precursor materials to the reaction chamber 9.

The apparatus comprises a second lead-through connection 33 provided to and extending from the vacuum chamber 8 between the vacuum chamber 8 and the second precursor source arrangement 3. Thus, the second lead-through connection 33 extends between the vacuum chamber 8 and the second precursor source arrangement 3. One or more second precursor supply conduits 32 are arranged to extend from the second precursor source arrangement 3 inside the vacuum chamber 8 via the second lead-through connection 33, as shown in FIG. 1.

The second lead-through connection 33 is provided with a second precursor supply connection 34 in the second precursor source arrangement 3. The second precursor supply conduit 32 is connected to the second precursor supply connection 34 in the second precursor source arrangement 3. The second precursor supply connection 34 may be flange or a plate or the like to which the second precursor supply conduit 32 may be connected or attached.

The second precursor supply conduit 32 is further connected to the inlet channel 92 inside the vacuum chamber 8 for supplying precursor material into the reaction chamber 9.

The second precursor source arrangement 3 comprises one or more precursor sources 35 for receiving and supporting one or more precursor containers for receiving and holding precursor containers in the second precursor source arrangement 3. The second precursor supply conduit 32 extends between the precursor source 35 and to the inlet channel 92 inside the vacuum chamber 8. Thus, the second precursor supply conduit 32 extends from the second precursor source arrangement 3 and from the precursor source 35 via the second lead-through connection 33 and the second precursor supply connection 34 to the inlet channel 92 inside the vacuum chamber 8. The precursors are supplied to the reaction chamber 9 along the second precursor supply conduit 32.

The second precursor source arrangement 3 further comprises a second precursor source casing 30 or compartment surrounding one or more precursor sources 35. The precursor sources 35 are arranged inside the second precursor source casing 30 in a second precursor source casing space 31.

The precursor source arrangement 2 is provided for solid precursors or low vapour pressure precursors.

Figure 2:
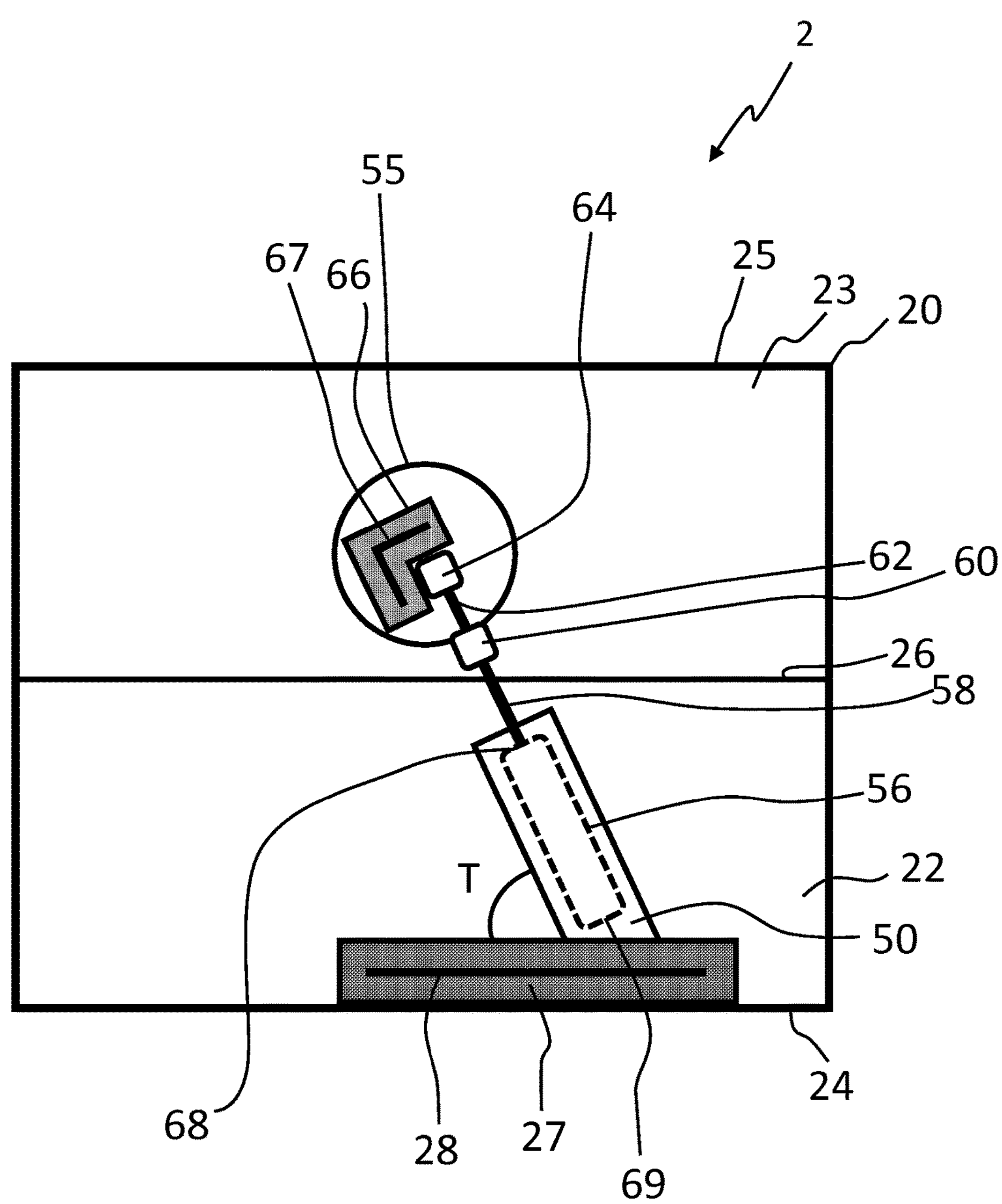
FIG. 2 shows a schematic view of one embodiment of a precursor source arrangement according to the present invention.

FIG. 2 shows schematically one embodiment of the precursor source arrangement 2 according to the present invention for liquid precursors.

The precursor source arrangement 2 comprises the precursor source compartment 20 having a compartment space 21 defined by precursor source compartment walls 20. The precursor source compartment 20 further comprises a partitioning wall 26 arranged to divide the compartment space 21 to an upper compartment space 23 and a lower compartment space 22 provided below the upper compartment space 23. The partitioning wall 26 extends horizontally or substantially horizontally or transversely to vertical direction such that the compartment space 21 to an upper compartment space 23 and a lower compartment space 22. The partitioning wall 26 is provided between the top wall 25 and the bottom wall 24 of the precursor source compartment 20.

The precursor source arrangement 2 comprises a precursor container support arrangement arranged to hold a liquid precursor container 56 in inclined position relative to vertical direction V.

The precursor container support arrangement comprises a base plate 27 arranged to the lower compartment space 22 inside the precursor source compartment 20. The base plate 27 is provided on a bottom wall 24 of the precursor source compartment 20 inside the lower compartment space 22.

Figure 8:
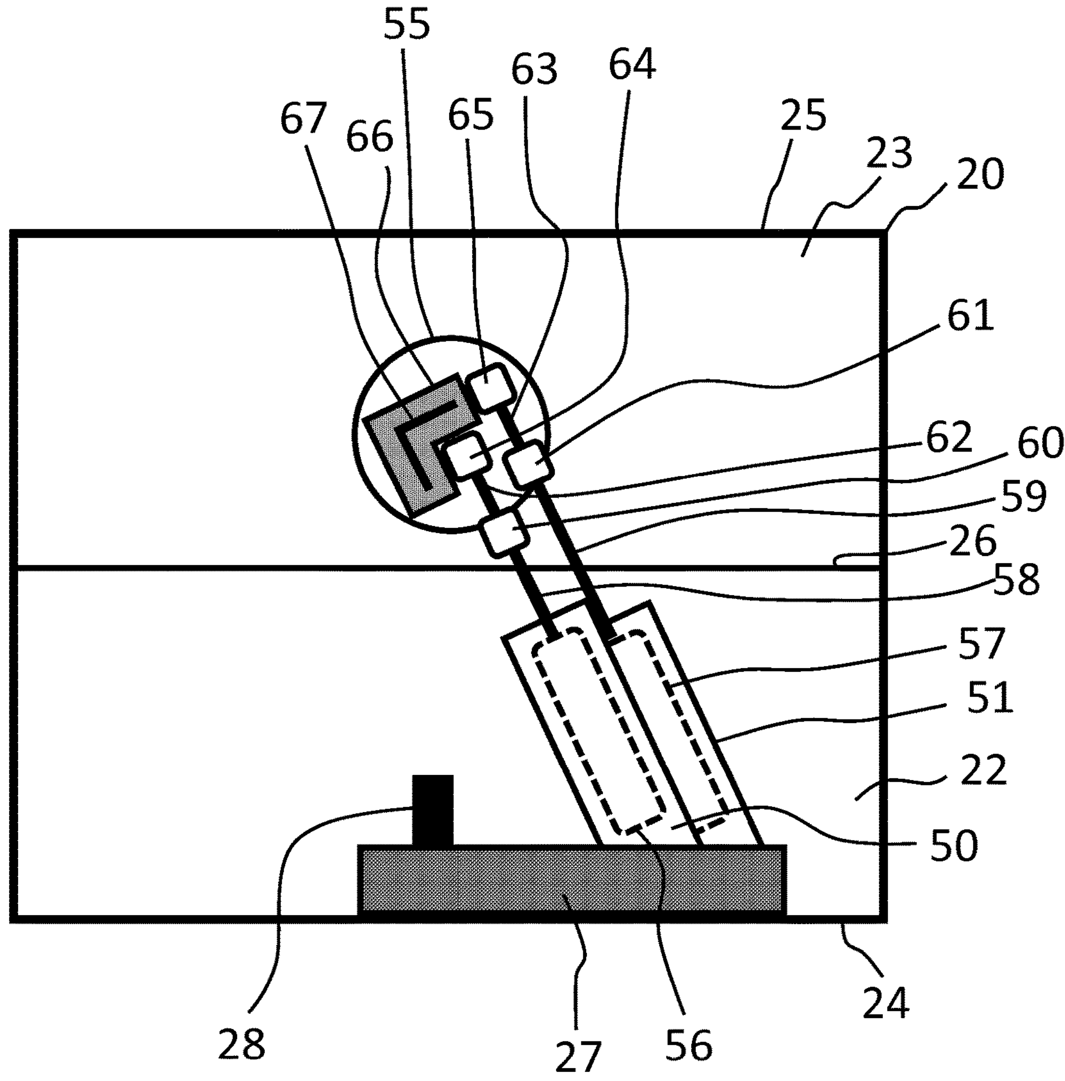
FIGS. 8, 9, 10, 11 and 12 show schematic views of different embodiments of a precursor source arrangement according to the present invention.

The base plate 27 is provided as a container heating element. Thus, the base plate may be made of aluminium of some other material having high thermal conductivity. The container heating element or base plate 27 is provided with a first heater 28. The first heater 28 may be an electrical heater or resistant heater. The first heater 28 may be connected, embedded or in heat transfer contact with the base plate or the container heating element 27. In the embodiment of FIG. 2, the first heater 28 is embedded inside the container heating element 27. In the embodiment of FIG. 8, the first heater 28 is provided on the container heating element 27 in contact or in heat transfer contact with the container heating element 27 for heating the container heating element 27.

The precursor container support arrangement further comprises a container support member 50 defining an inclined support plane inclined relative to vertical direction V for supporting the liquid precursor container 56 in the inclined position.

The liquid precursor container 56 comprises an upper end 68 provided with an outlet connection 58, 60, 62 via which precursor may be supplied out of the precursor container 56. The liquid precursor container 56 further comprises a lower end 69 or bottom opposite the upper end 68. In the embodiments, the liquid precursor container 56 is arranged in inclined position such that the upper and 68 of the liquid precursor container 56 is above the lower end 69.

Figure 3:
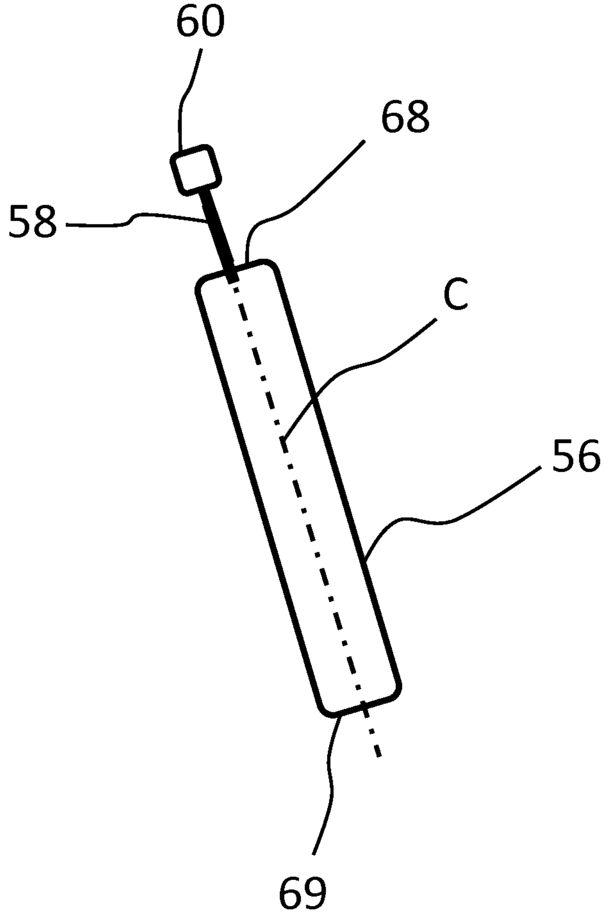
FIG. 3 shows a schematic view of a liquid precursor container.

FIG. 3 shows the liquid precursor container is more detail. The liquid precursor container 56 comprises the upper and 68 having an outlet opening or outlet connection 58, 60, 62 and a bottom or bottom wall 69 opposite outlet connection. The outlet connection comprises outlet conduit 58 and a container valve 60 for opening and closing the liquid precursor container 56. The liquid precursor container 56 further comprises a container axis C extending between the outlet connection 58, 60 or the upper end 68 and the bottom 69. Thus, the liquid precursor container 56 is in inclined position relative to vertical direction V when the container axis C extends in the inclined position when the liquid precursor container 56 is installed to the precursor source arrangement 3 and supported to the precursor container support arrangement.

The container support member 50 of the support plane or surface thereof extends in inclined position also relative to horizontal direction with an angle T, as shown in FIG. 2. Thus, the container support member 50 of the support plane or surface thereof extends in inclined position between horizontal direction and vertical direction.

The container support member 50 is arranged to receive the liquid precursor container 56 and to support the liquid precursor container 56. Preferably, the liquid precursor container 56 is arranged to be received and supported against the container support member 50 or the support plane or surface thereof.

The container support member 50 is connected or attached to the container heating element 27. The container heating element 27 is arranged to heat the container support member 50 for heating the liquid precursor container 56. Further, the container heating element 27 is connected to the container support member 50, or the container support member 50 is connected to the container heating element 27, such that the container support member 50 extends upwards from the container heating element 27. The container heating element 27 is arranged to heat the container support member 50 for heating the liquid precursor container 56.

Thus, the base plate or the container heating element 27 is arranged to heat the precursor container support 50 from below. In one embodiment, the container support member is made of aluminium or other good heat transfer material enabling efficient heat transfer to the liquid precursor container.

As shown in FIG. 2, the precursor container support arrangement is provided to the lower compartment space 22. Further, the container support member 50 is provided to the lower compartment space 22. Additionally, the container heating element 27 or the base plate is provided to the lower compartment space 22.

The precursor source arrangement 2 further comprises the precursor supply valve 64 provided to the precursor supply line 52. The precursor source arrangement comprises a valve support member 66. The supply valves 64 is supported to the valve support member 66.

The valve support member 66 comprises a valve heating element or heater 67 provided to the valve support member 66 for heating the one or more precursor supply valve 64. The valve heater 67 may be an electrical heater or resistant heater. The valve heater 67 may be connected, embedded or in heat transfer contact with the valve support member 66. In the embodiment of FIG. 2, the valve heater 67 is embedded inside the valve support member 66.

The valve support member 66 may be made of aluminium of some other material having high thermal conductivity for heating and transferring thermal energy to the supply valve 64.

The valve support member 66 is arranged to extend in horizontal direction or substantially horizontal direction or transversely to vertical direction. The valve support member 66 is arranged in vertical direction above the precursor container support arrangement and in vertical direction above the container support member 50, as shown in FIG. 2.

Further, the valve support member 66 is provided to the upper compartment space 23. Thus, the supply valve 64 and the valve support member 66 are provided to the upper compartment space 23 above the partition wall 26.

The valve support member 66 is further connected to the first precursor supply connection 55 of the first lead-through connection 54. The outlet connection or outlet conduit 58, 60, 62 of the liquid precursor container 56 is connected to the supply valve 64. The supply valve 64 is supported to the valve support member 66 such that the supply valve 64 and the precursor may be heated. The valve support member 66 may be further heated by the first lead through connection 54 and the first precursor connection 55. The first lead through connection 54 provides thermal energy from the heated vacuum chamber 8 to the valve support member 66. Thus, the valve heating element 67 may also be omitted in some embodiments.

As shown in FIG. 2, the precursor container support arrangement and the container support member 50 are arranged to the lower compartment space 22 and the valve support member 66 and the precursor supply valve 64 are arranged in vertical direction above the container support member 50 in the upper compartment space 23. The outlet connection or outlet conduit 58, 60, 62 of the liquid precursor container 56 is arranged to extend from the lower compartment space 22 to the upper compartment space 23 through the partition wall 26. The partition wall 26 comprises a partition wall opening for the outlet connection or outlet conduit 58, 60, 62 and the outlet connection or outlet conduit 58, 60, 62 extends through the partition wall opening. The outlet connection or outlet conduit 58, 60, 62 extends from the liquid precursor container 56 to the supply valve 64.

Figure 4:
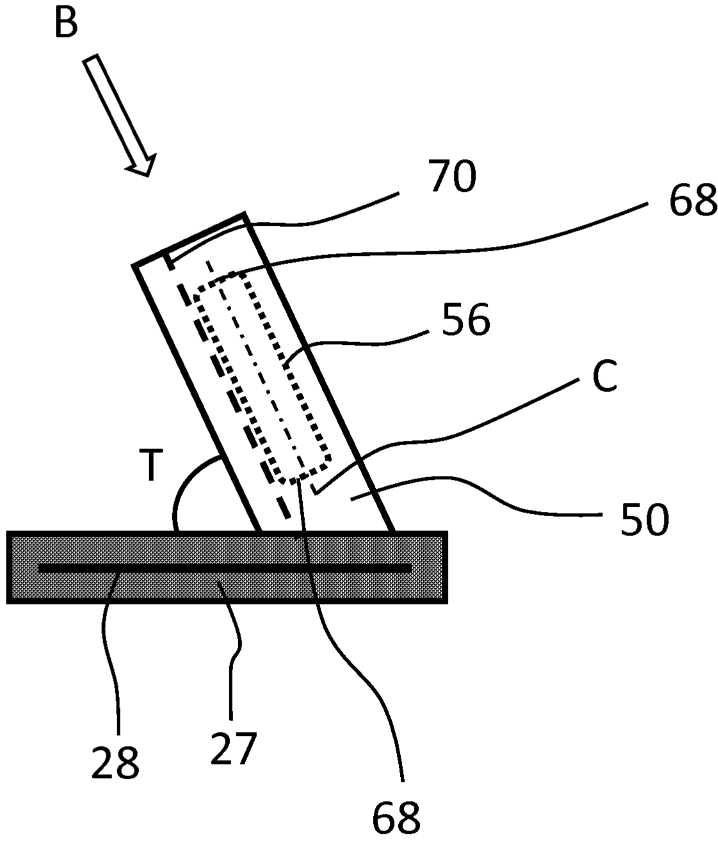
FIG. 4 shows a schematic view of another embodiment of a precursor source arrangement according to the present invention.

FIG. 4 shows schematically the precursor container support arrangement with the container heating element or base plate 27 and the container support member 50 as well as the liquid precursor container 56.

The container support member 50 comprises a support surface 70 against which the liquid precursor container 56 is arranged to be supported. The support surface 70 forms the support element of the precursor container support arrangement and provides the inclined support plane inclined relative to vertical direction V for supporting the liquid precursor container 56. Accordingly, the support surface 70 defines the inclined position of the liquid precursor container 56 or for the liquid precursor container 56.

It should be understood, that the inclined position of the liquid precursor container 56 is provided by the container support member 50 and the support surface 70 thereof, as shown in FIG. 4. The liquid precursor container 56 is supported on and against the support surface 70.

FIGS. 5A, 5B, 5C and 5D show different kinds of container support members 50 and support surfaces 70.

Figure 5A:
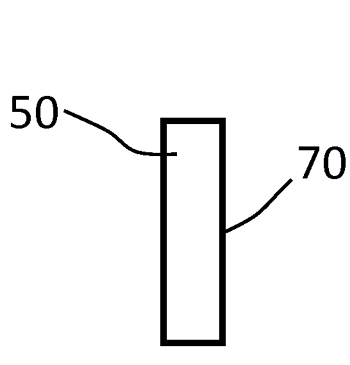
FIGS. 5A, 5B, 5C and 5D show schematic view of different container support members.

FIG. 5A shows a container support member 50 which is a support plate having the support surface 70 or planar support surface 70 arranged to receive and support the liquid precursor container 56.

Figure 5B:
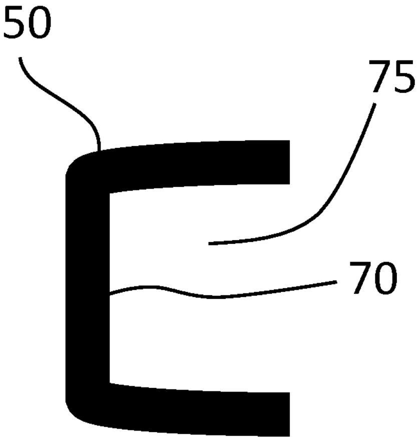
Figure 5C:
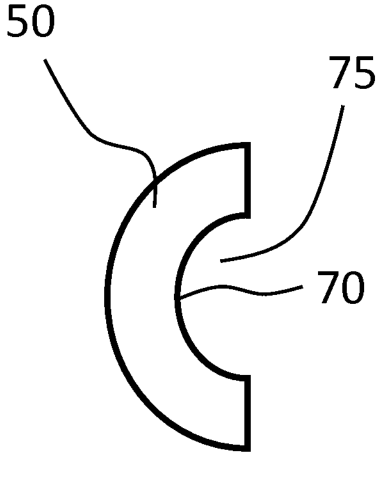

FIGS. 5B and 5C show the container support members 50 which are members having a longitudinal recess 75 or groove extending along the support surface 70 and arranged to receive and support the liquid precursor container 56. The liquid precursor container 56 is placed into the recess 75 and against the inner recess surface 70 forming the support surface 70. Thus, the contact area between the liquid precursor container 56 and the support surface 70 is increased.

Figure 5D:
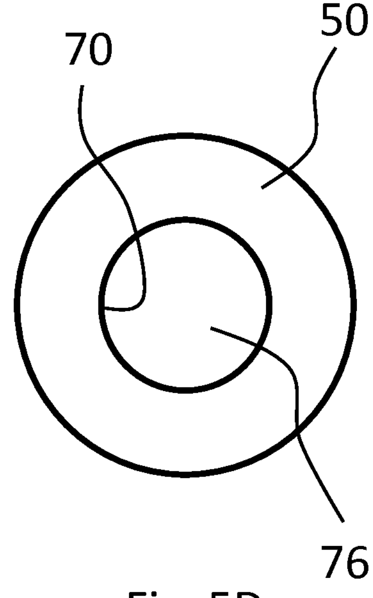

FIG. 5D shows another the container support member 50 which is provided as a sleeve comprising the support surface 70. The sleeve comprises a longitudinal hole 76 having an inner surface 70 forming the support surface 70. The hole 76 is arranged to receive the liquid precursor container 56 and surround and support the liquid precursor container 56.

Figure 6:
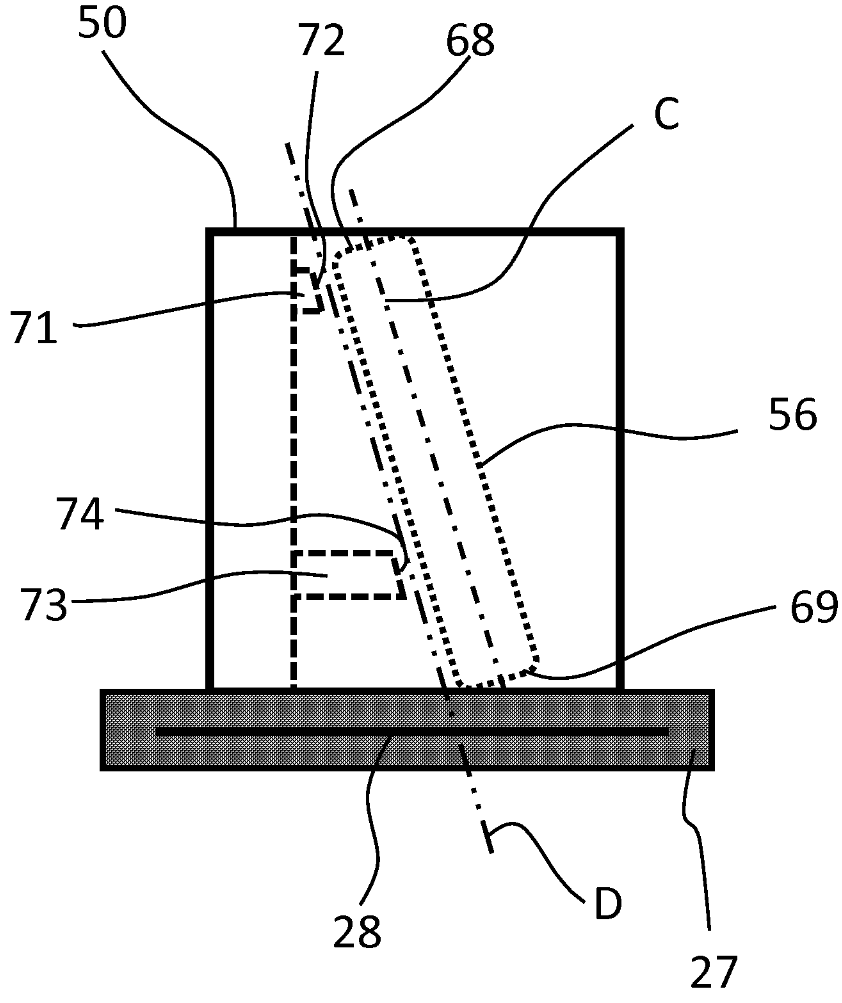
FIG. 6 shows a schematic view of yet another embodiment of a precursor source arrangement according to the present invention.
Figures 7A, 7B, 7C:
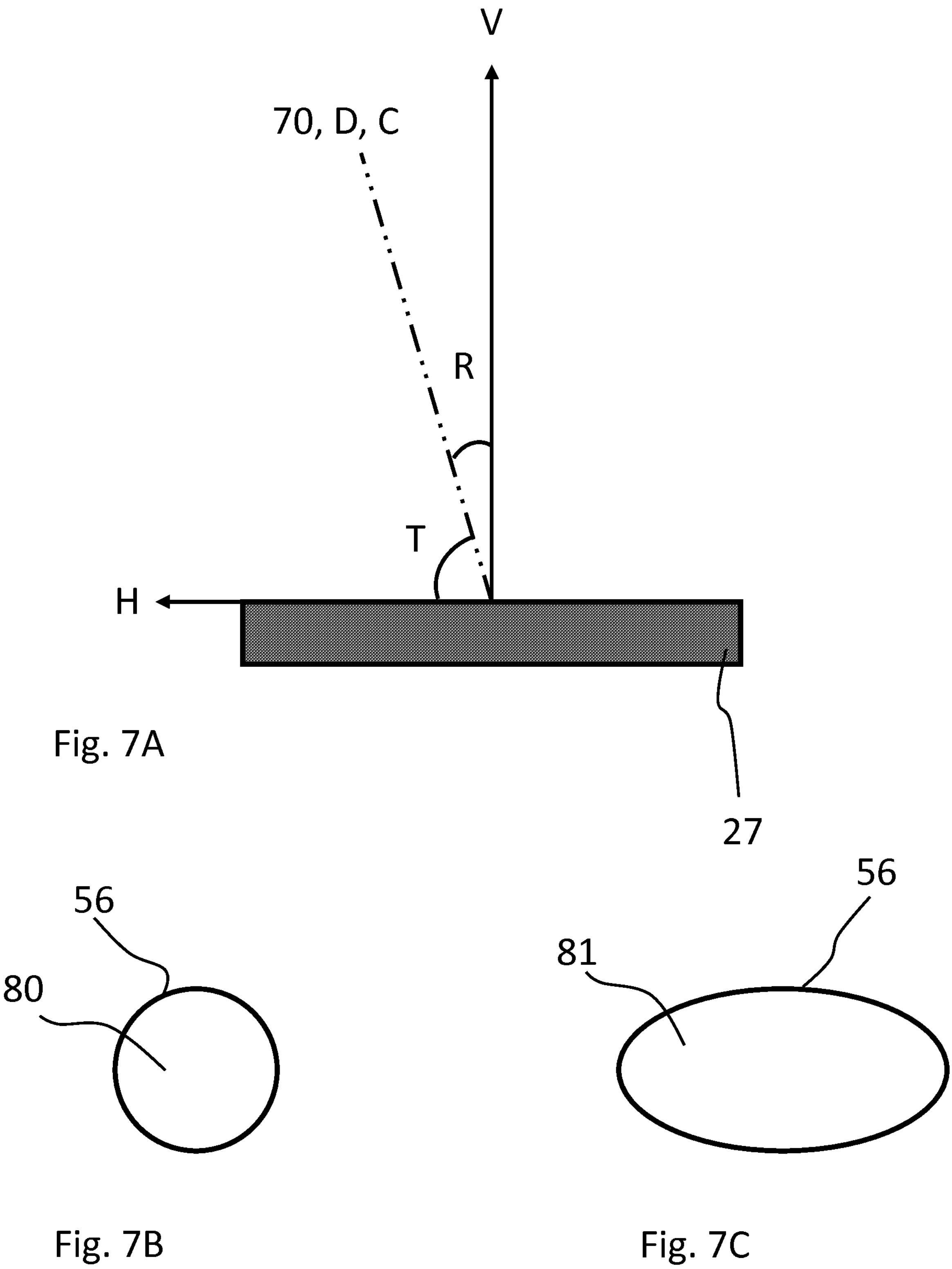
FIGS. 7A, 7B and 7C show principle of inclining the liquid precursor container.

FIG. 6 shows an alternative embodiment, in which the container support member 50 comprises two or more separate support elements 71, 73 having separate support surfaces 72, 74, respectively. The separate support surfaces 72, 74 of the two or more separate support elements 71, 73 define together the inclined support plane D inclined relative to vertical direction V for supporting the liquid precursor container 56 in the inclined position. The may also be only one separate support element 71, 73 having a separate support surface 72. Accordingly, in this embodiment, the precursor container 56 is supported with one or more separate support elements 71, 73 in local on point-like manner. FIGS. 7A, 7B and 7C show schematically the principle of arranging the precursor container 56 in inclined position. The container axis C, the support plane D and/or the support surface 70 is arranged in inclined position relative to the vertical direction V. The base plate 27 or the container heating element 27 extends in horizontal direction H. Thus, the container axis C, the support plane D and/or the support surface 70 is arranged to extend in the inclined position from the base plate 27 between the horizontal direction and the vertical direction V.

As shown in FIG. 7A, the container axis C, the support plane D and/or the support surface 70 is arranged in inclined position relative to vertical direction V an inclination angle R. The inclination angle R is between 5 to 75 degrees, or preferably between 10 to 60 degrees, or more preferably between 20 to 50 degrees.

FIG. 7B shows the liquid surface area 80 in a liquid precursor container 56 which in upright position, meaning the inclination angle R in relation to vertical direction V is zero. The FIG. 7C shows an increased liquid surface area 81 in a liquid precursor container 56 which in inclined position at an inclination angle R in relation to vertical direction V is zero according to the present invention. As may be seen, the liquid surface increases as the liquid precursor container 56 is inclined. Thus, the liquid surface area 81 for vaporization also increases.

FIG. 8 shows an embodiment in which a first container support member 50 and a second container support member 51 are connected on the base plate 27 and arranged adjacently or successively to each other. The first and second container support members 50, 51 extend from the base plate 27 in the inclined positions relative to the vertical direction V. In this embodiment, the first and second container support members 50, 51 are arranged to extend with same inclination angle to the base plate 27.

The second container support member 51 supports a second liquid precursor container 57. The valve support member 66 comprise a second precursor supply valve 65. An outlet connection or outlet conduit 59, 61, 63 of the second liquid precursor container 57 is connected to the second supply valve 65. The supply valve 64 is supported to the same valve support member 66 as the first precursor supply valve 64 such that the first and second supply valves 64, 65 and the precursor may be heated.

As shown in FIG. 2, the first and second container support members 50, 51 are arranged to the lower compartment space 22 and the valve support member 66 and the first and second precursor supply valve 64, 65 are arranged in vertical direction above the first and second container support members 50, 51 in the upper compartment space 23. The outlet connections or outlet conduits 58, 60, 62, 59, 61, 63 of the first and second liquid precursor containers 56, 57 are arranged to extend from the lower compartment space 22 to the upper compartment space 23 through the partition wall 26. The partition wall 26 comprises a partition wall opening for the outlet connections or outlet conduits 58, 60, 62, 59, 61, 63 and the outlet connections or outlet conduits 58, 60, 62, 59, 61, 63 extend through the partition wall opening.

Figure 9:
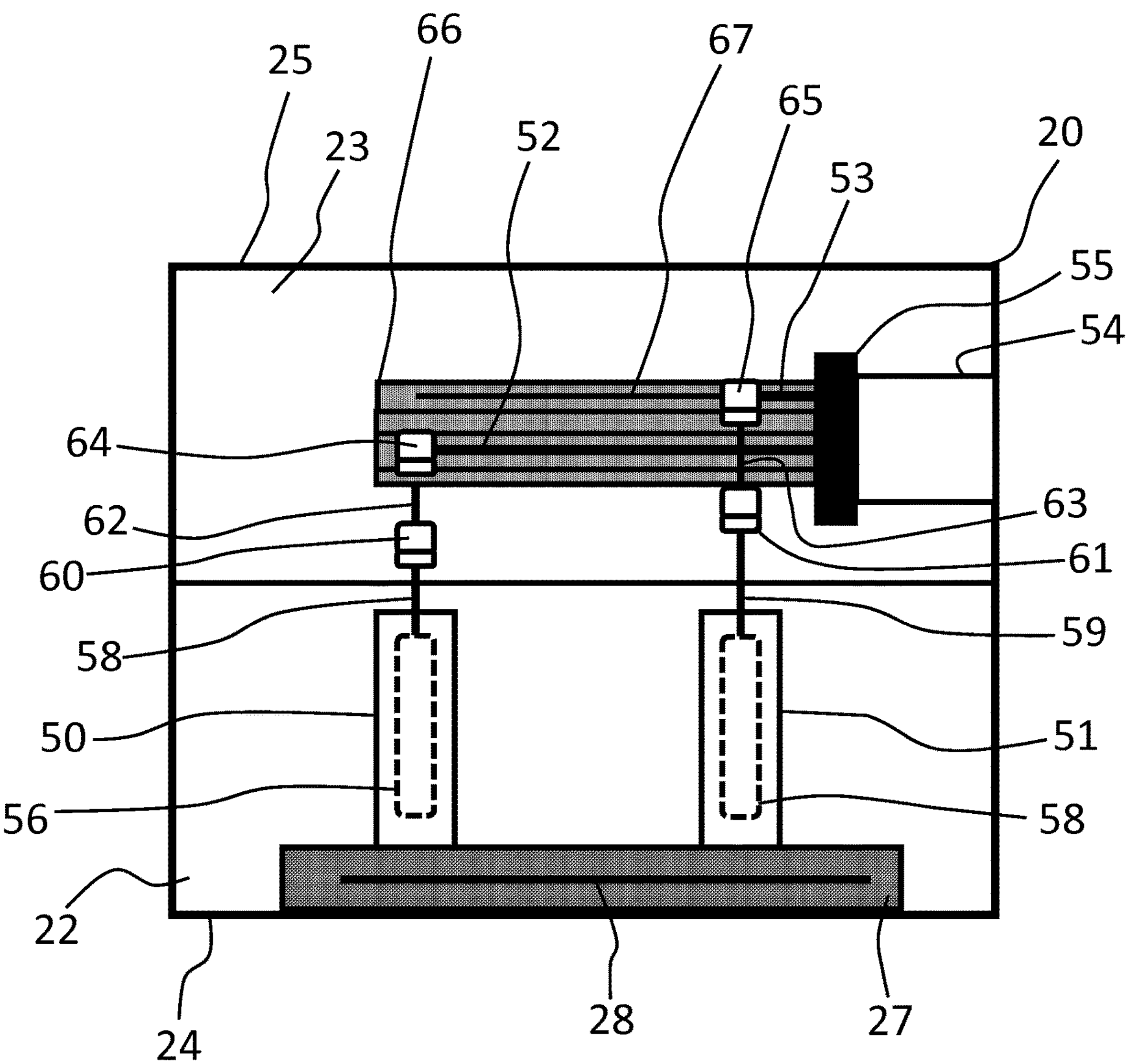

The first and second supply valve 64, 65 are arranged at different heights to the vertical direction V to the valve support member 66, as shown in FIG. 9. Thus, the first precursor supply valve 64 is connected to the first precursor supply channel 52 and the second precursor supply valve 65 is connected to the second precursor supply channel 53. Arranging the first and second supply valve 64, 65 are arranged at different heights to the vertical direction V to the valve support member 66 enables providing the first and second precursor supply channels 52, 53 as straight channels along the valve support member 66 to the first precursor supply connection 55.

The valve support member 66 is connected to the first precursor supply connection 55. Thus, the valve support member 66 extends from the first precursor supply connection 55 into the upper compartment space 23.

Figure 10:
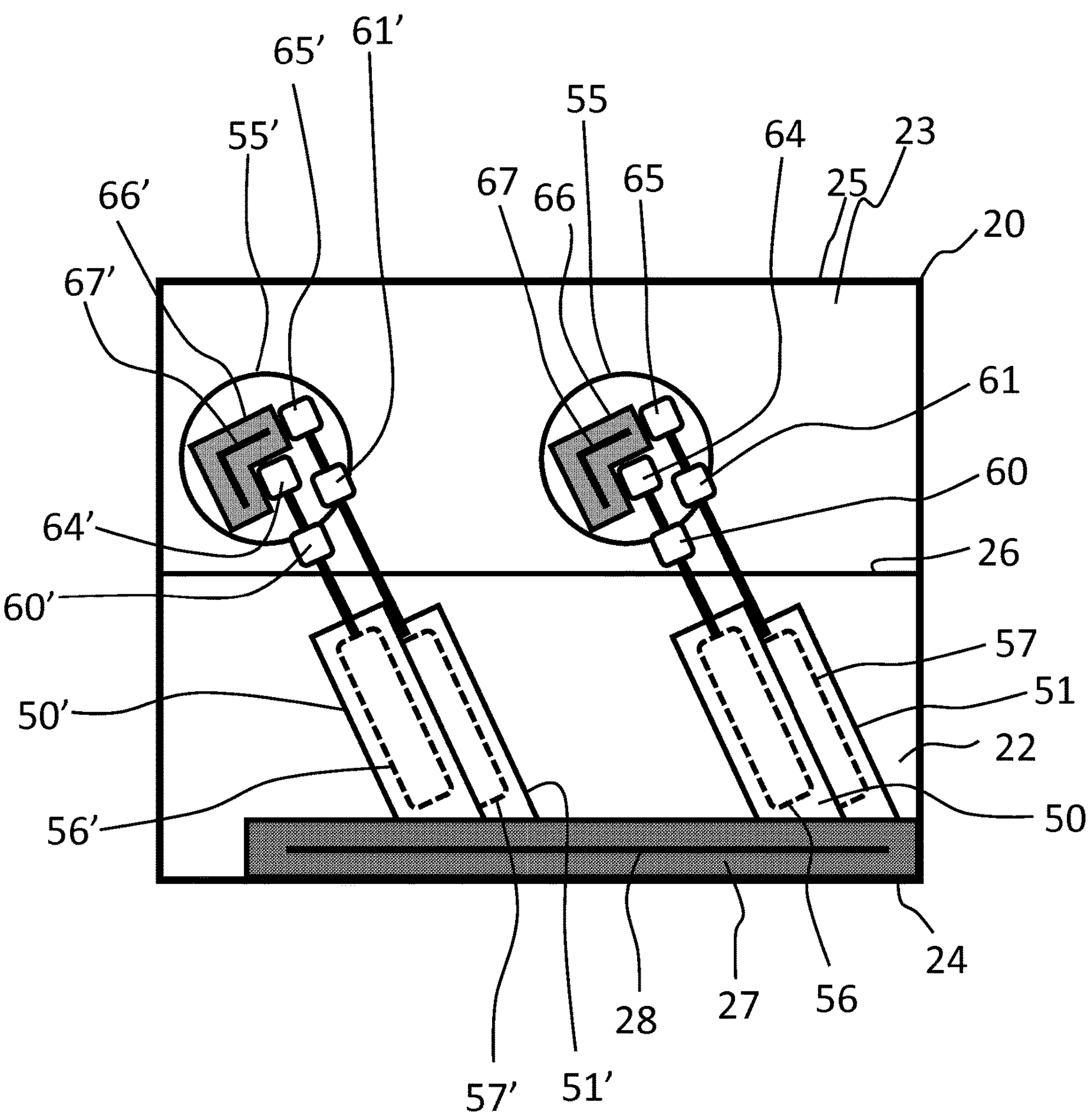

FIG. 10 shows an alternative embodiment in which there is two first lead-through connections 54, 54' and two first precursor supply connections 55, 55'. Thus, there are also two valve support members 66, 66', 67, 67' connected respectively to the two first precursor supply connections 55. Further, there is two similar precursor container support arrangements 50, 50', 51, 51', 60, 60', 61, 61'. The container support arrangements 50, 50', 51, 51' are arranged to support the first and second liquid precursor containers 56, 56', 57, 57' in inclined positions.

Figure 11:
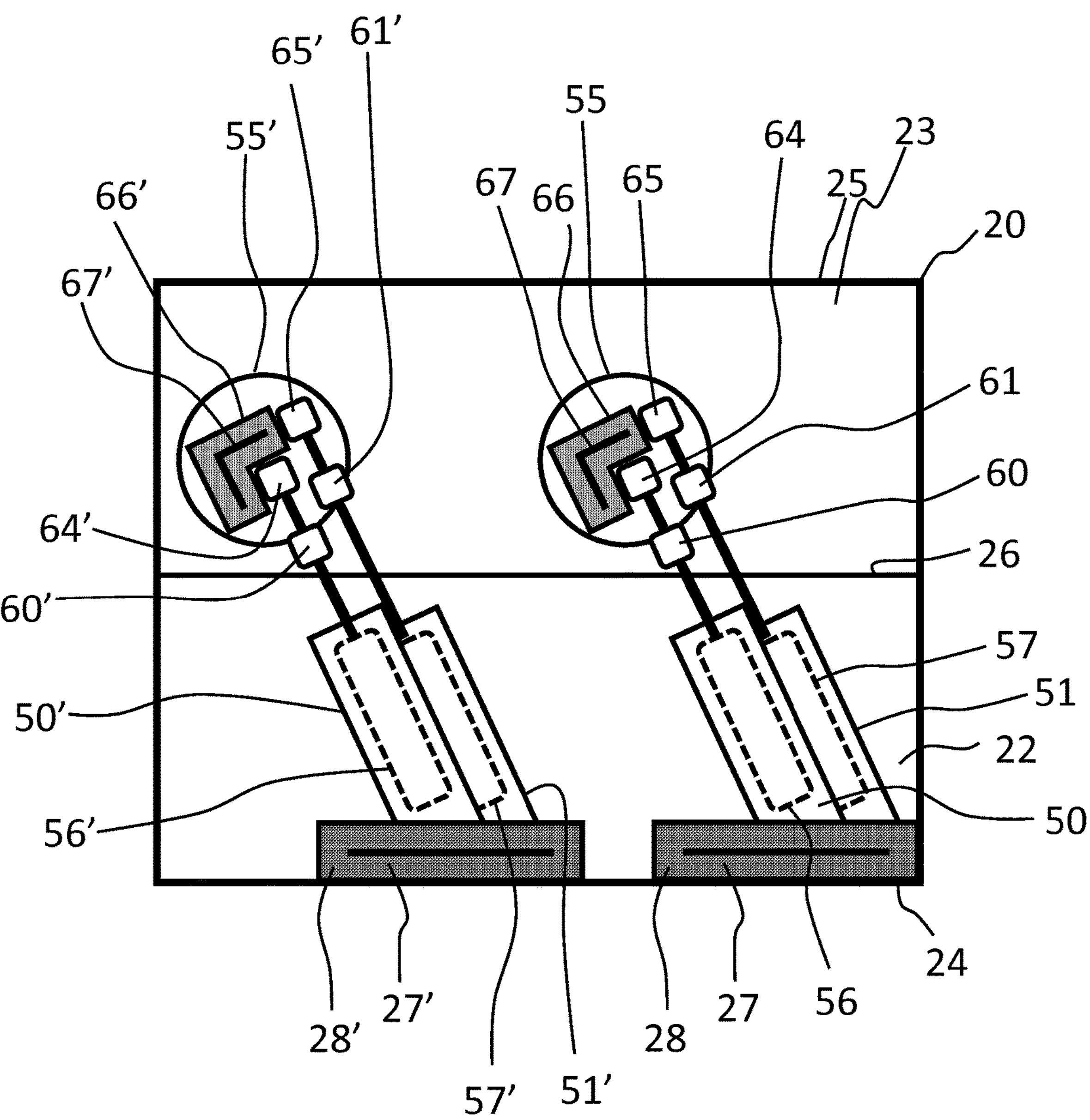

FIG. 11 corresponds the embodiment of FIG. 11, but there are two separate base plates 27, 27', 28, 28' or container heating elements. There is one container heating element 27, 27' for each of the two valve support members 66, 66' and for each of the two first precursor supply connections 55, 55'. Thus, the supply valves 64, 65 and the supply valves 64', 65' may be heated separately with the separate valve support members 66, 66', possibly to different temperatures. Similarly, the container supports 50, 51 and container supports 50', 51 may be heated separately with the separate container heating element 27, 27', possibly to different temperatures.

Figure 12:
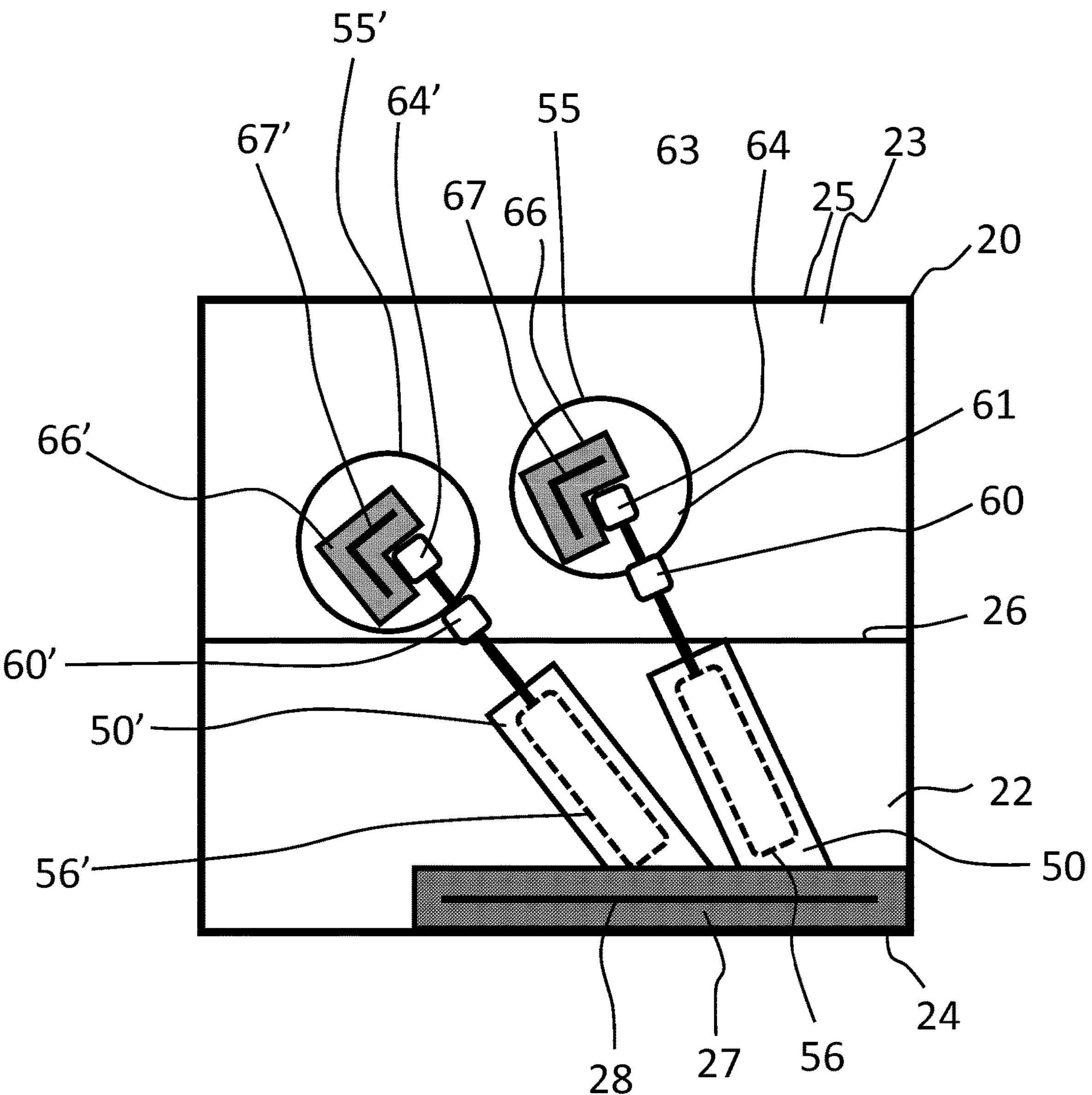

FIG. 12 shows one embodiment, in which the precursor container support arrangement comprises a first and a second container support members 50, 50' connected on the container heating element 27, 28 and arranged adjacently or successively to each other and to extend from the heating element 27, 28 in the inclined positions relative to the vertical direction V. The first and a second container support members 50, 50' defining inclined support planes or support surfaces D, 70 inclined at different inclination angles relative to vertical direction V for supporting the liquid precursor container 56 and 56' in the inclined positions.

The different inclination angles may be used in any embodiments of the invention.

Further in FIG. 12, the second container support member 50' is connected on the base plate 27 under or below the inclined first container support member 50. This means that the second container support member 50' is connected base plate 27 under the inclined part of the first container support member 50. Thus, the first container support member 50 extends in the inclined position from the base plate 27 and the second container support member 50' is connected to the base plate 27 in the area between the first container support member 50 and the base plate 27.

As in FIG. 12, the first and second container support members 50, 50*a* of the support surfaces 70 thereof extend in different inclination angles from the base plate 27, the second container support member 50' may be connected on the base plate 27 under or below the inclined first container support member 50 even if the inclination angles of the first and second container supports are same.

The invention has been described above with reference to the examples shown in the figures. However, the invention is in no way restricted to the above examples but may vary within the scope of the claims.

The invention claimed is:

1. A precursor source arrangement for an atomic layer deposition apparatus for receiving a liquid precursor container for liquid precursor, wherein the precursor source arrangement comprises:

a precursor source compartment having a compartment space, the precursor source compartment comprising a partitioning wall arranged to divide the compartment space into an upper compartment space and a lower compartment space provided below the upper compartment space;

a precursor container support arrangement including a container support member arranged to hold the liquid precursor container in a fixed inclined position relative to a vertical direction, the precursor container support arrangement comprising a base plate arranged to the lower compartment space inside the precursor source compartment, the base plate being provided on a bottom wall of the precursor source compartment and the container support member being connected on the base plate and arranged to extend from the base plate;

a container heating element in contact with the container support member and arranged to heat the container support member for heating the liquid precursor container, the base plate being provided as the container heating element; and a valve support member supporting one or more precursor supply valves, the valve support member arranged in the vertical direction above the container support member in the upper compartment space, the valve support member comprising a valve heating element in contact with the valve support member for heating the one or more precursor supply valves, wherein the precursor container support arrangement is provided within the lower compartment space, the valve support member is provided within the upper compartment space, and an outlet conduit is arranged to extend from the lower compartment space to the upper compartment space through the partition wall, the liquid precursor container defining an outlet opening which is connected to the precursor supply valve via the outlet conduit.

2. The precursor source arrangement according to claim 1, wherein the container support member defines an inclined support plane inclined relative to the vertical direction for supporting the liquid precursor container in the fixed inclined position.

3. The precursor source arrangement according to claim 2, wherein the container support member comprises:

a support surface against which the liquid precursor container is arranged to be supported, the support surface forming a support element of the precursor container support arrangement and providing the inclined support plane inclined relative to the vertical direction for supporting the liquid precursor container.

4. The precursor source arrangement according to claim 3, wherein:

the container support member is a support plate having the support surface arranged to receive and support the liquid precursor container; or the container support member is a support plate having a longitudinal recess extending along the support surface arranged to receive and support the liquid precursor container; or the container support member is provided as a sleeve comprising the support surface and a longitudinal recess extending along the support surface arranged to receive and support the liquid precursor container.

5. The precursor source arrangement according to claim 2, wherein the inclined support plane is inclined relative to the vertical direction at an inclination angle, the inclination angle being:

between 5 degrees and 75 degrees; or between 10 degrees and 60 degrees; or between 20 degrees and 50 degrees.

6. The precursor source arrangement according to claim 1, wherein the precursor source arrangement comprises:

two adjacently or successively arranged container support members arranged to hold the liquid precursor container in different inclined positions relative to the vertical direction.

7. The precursor source arrangement according to claim 1, wherein the precursor source arrangement comprises:

a base plate, a first container support member, and a second container support member, the first container support member and the second container support member connected on the base plate and arranged adjacently or successively to each other and to extend from the base plate in the fixed inclined position relative to the vertical direction, the second container support member being connected on the base plate under the first container support member; or the heating element, a first container support member, and a second container support member, the first container support member and the second container support member connected on the heating element and arranged adjacently or successively to each other and to extend from the heating element in the fixed inclined position relative to the vertical direction, the second container support member being connected on the heating element under the first container support member.

8. The precursor source arrangement according to claim 1, wherein:

two or more of the container support members are connected to the same container heating element; or the precursor container support arrangement comprises two or more container heating elements, and one or more container support members are connected to each of the two or more container heating elements.

9. The precursor source arrangement according to claim 1, wherein:

the precursor source arrangement comprising two or more valve support members, the one or more precursor supply valves being supported by each of the two or more valve support members.

10. The precursor source arrangement according to claim 1, wherein the container heating element is provided in heat transfer connection with the container support member for heating the liquid precursor container.

11. The precursor source arrangement according to claim 1, wherein the precursor source arrangement comprises two adjacently or successively arranged container support members comprising container support members defining inclined support planes inclined at different angles relative to the vertical direction for supporting the liquid precursor container in the fixed inclined position.

12. The precursor source arrangement according to claim 1, wherein the container heating element is in direct physical contact with the container support member.

13. The precursor source arrangement according to claim 1, wherein the valve heating element is in direct physical contact with the valve support member.

14. An atomic layer deposition apparatus for processing a substrate according to principles of atomic layer deposition method, the apparatus comprising:

a vacuum chamber;

a reaction chamber inside the vacuum chamber;

a process heater arranged inside the vacuum chamber for heating the reaction chamber;

a precursor source arrangement for one or more liquid precursor containers, the precursor source arrangement comprising a precursor source compartment defining a compartment space, the precursor source compartment comprising a partitioning wall arranged to divide the compartment space into an upper compartment space and a lower compartment space provided below the upper compartment space;

a lead-through connection extending from the vacuum chamber and into the precursor source compartment of the precursor source arrangement; and one or more precursor supply channels extending from the precursor source arrangement inside the vacuum chamber via the lead-through connection, the one or more precursor supply channels being provided with one or more precursor supply valves for supplying precursors, wherein the precursor source arrangement comprises:

a container support member defining an inclined support plane inclined relative to a vertical direction for supporting the one or more liquid precursor containers in a fixed inclined position relative to the vertical direction, the container support member positioned inside the lower compartment space of the precursor source compartment, a base plate arranged within the lower compartment space inside the precursor source compartment, the base plate being provided on a bottom wall of the precursor source compartment and the container support member being connected on the base plate and arranged to extend from the base plate;

a valve support member supporting the one or more precursor supply valves, the valve support member being provided separately from the container support member and being positioned inside the upper compartment space of the precursor source compartment, wherein the valve support member is connected to the lead-through connection inside the precursor source compartment for providing heat transfer from the vacuum chamber to the valve support member; and a container heating element in contact with the container support member and arranged to heat the container support member for heating the liquid precursor container, the container support member being provided within the lower compartment space; and the lead-through connection and the valve support member being provided within the upper compartment space.

15. The apparatus according to claim 14, wherein the container heating element is in direct physical contact with the container support member.

* * * * *